United States Patent [19]

Speiser et al.

[11] 3,723,916

[45] Mar. 27, 1973

[54] SURFACE WAVE MULTIPLEX TRANSDUCER DEVICE WITH GAIN AND SIDE LOBE SUPPRESSION

[75] Inventors: Jeffrey M. Speiser; Harper John Whitehouse, both of San Diego, Calif.

[73] Assignee: The United States of America as represented by the Secretary of the Navy

[22] Filed: Oct. 1, 1971

[21] Appl. No.: 185,628

[52] U.S. Cl. ........................333/30, 310/9.7, 310/9.8

[51] Int. Cl. ........................H03h 7/30

[58] Field of Search ....................333/30; 310/9.7, 9.8

[56] References Cited

UNITED STATES PATENTS

| | | | |
|---|---|---|---|
| 3,551,837 | 12/1970 | Speiser et al. | 333/30 |
| 3,675,163 | 7/1972 | Hartmann et al | 310/9.8 |
| 3,675,052 | 7/1972 | Lindsay et al. | 333/30 |
| 3,648,081 | 3/1972 | Lean et al | 333/30 |
| 3,573,673 | 4/1971 | De Vries et al | 333/30 |

*Primary Examiner*—Herman Karl Saalbach
*Assistant Examiner*—Saxfield Chatmon, Jr.
*Attorney*—Richard S. Sciascia

[57] ABSTRACT

A surface wave multiplex transducer device, having N propagation paths, comprising a substrate and N–*n* composite launch vertical stacks of transducers, where $N \geq 3$ and $O \leq n \leq N-1$, each stack consisting of N transducers whose inputs are connected together, disposed upon the substrate in a parallel relationship and capable of transmitting N parallel surface waves across the substrate. Included are N-*n* composite receiving vertical stacks of transducers, each stack consisting of N transducers whose outputs are connected together, the *j*-th receiving stack being identical to the corresponding *j*-th launch stack, the receiving vertical stacks being disposed upon the substrate in a parallel relationship to the launch vertical stacks of transducers, so as to receive the N parallel launched surface waves. The (N-*n*)N launch and the (N-*n*)N receiving stacks of transducers are so coded that the response of the *j*-th receiving stack to an impulse applied to the *k*-th launch stack is an impulse if the numbers *j* and *k* are equal and zero if *j* and *k* are unequal.

7 Claims, 5 Drawing Figures

GENERAL FORM OF MULTIPLEX SURFACE WAVE TRANSDUCER DEVICE WITH GAIN AND SIDELOBE SUPPRESSION.

Patented March 27, 1973 3,723,916

3 Sheets-Sheet 1

DELAY LINE CONFIGURATION WITH SHIELDING ELECTRODES.

GENERAL FORM OF MULTIPLEX SURFACE WAVE TRANSDUCER DEVICE WITH GAIN AND SIDELOBE SUPPRESSION.

INVENTORS.
JEFFREY M. SPEISER,
HARPER JOHN WHITEHOUSE,
BY ERVIN F. JOHNSTON,
ATTORNEY.
JOHN STAN,
AGENT.

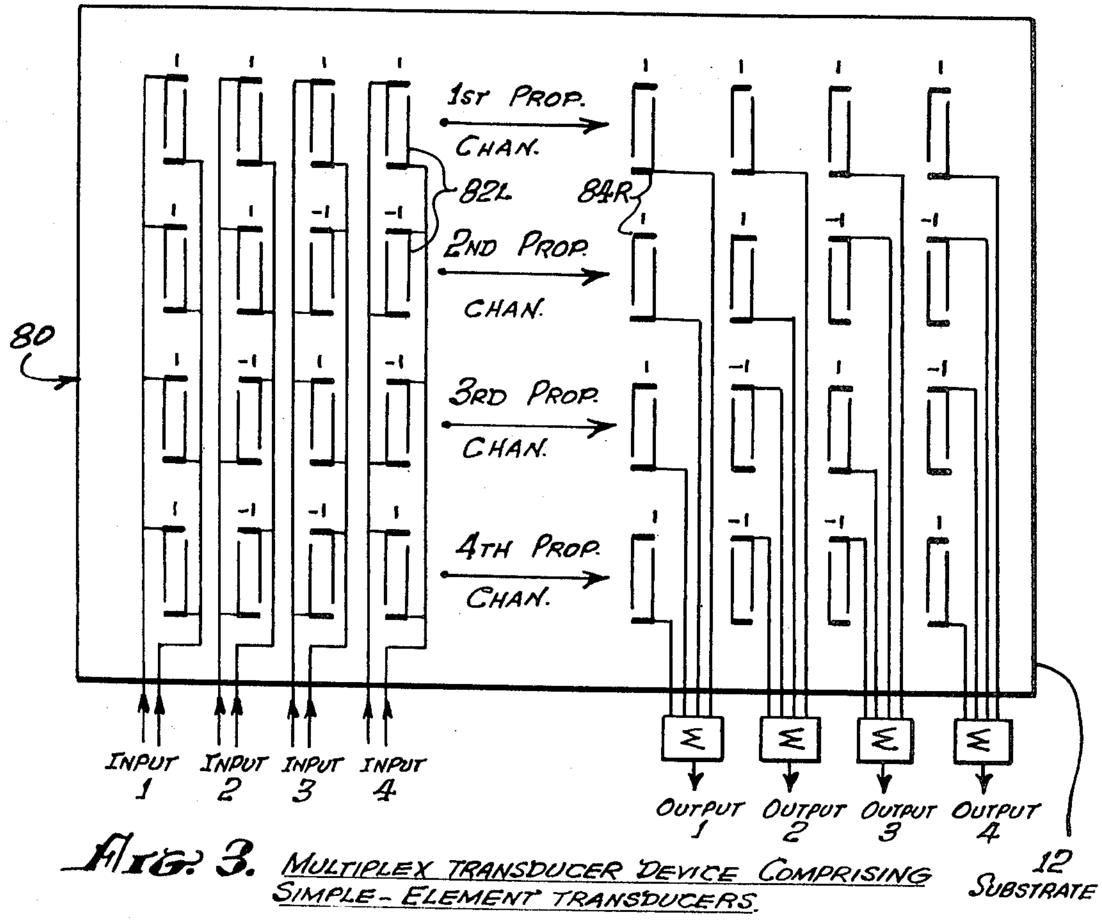
FIG. 3. MULTIPLEX TRANSDUCER DEVICE COMPRISING SIMPLE-ELEMENT TRANSDUCERS.
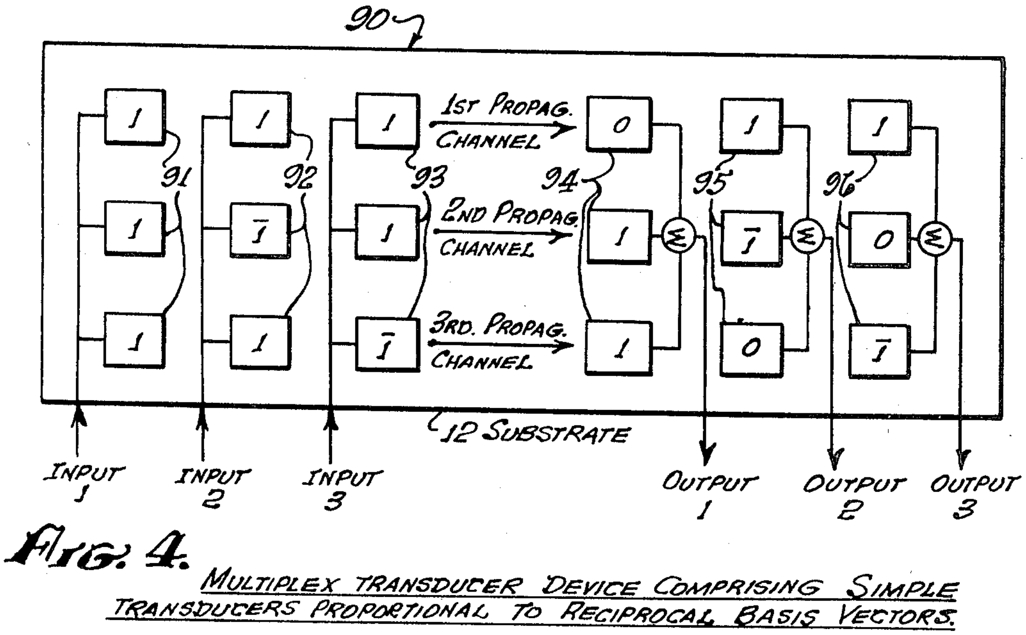
FIG. 4. MULTIPLEX TRANSDUCER DEVICE COMPRISING SIMPLE TRANSDUCERS PROPORTIONAL TO RECIPROCAL BASIS VECTORS.

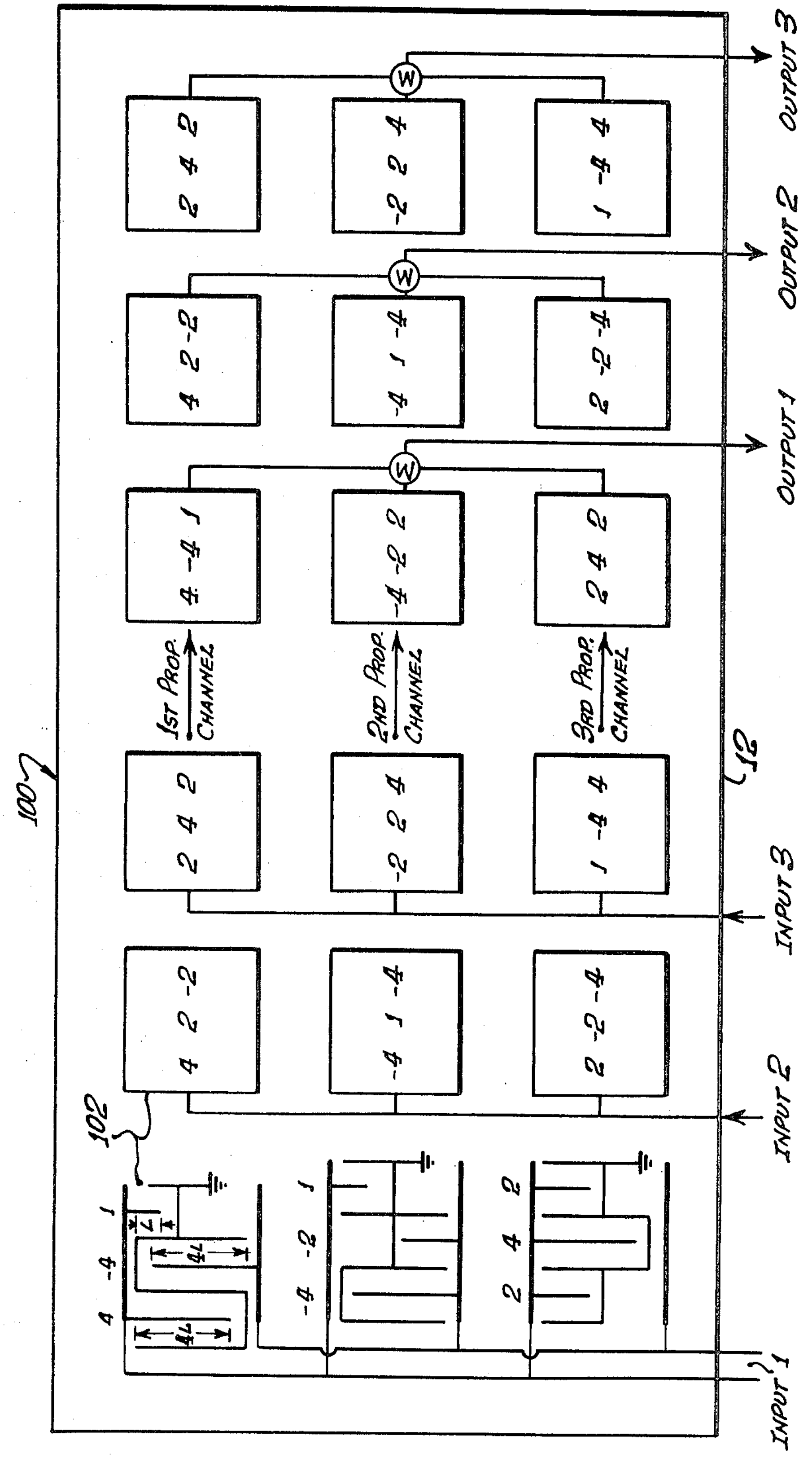
FIG. 5. MULTIPLEX TRANSDUCER DEVICE COMPRISING COMPLEX TRANSDUCERS.

SURFACE WAVE MULTIPLEX TRANSDUCER DEVICE WITH GAIN AND SIDE LOBE SUPPRESSION

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates to a distributed-transducer multiplex acoustic wave device which includes a substrate, generally crystalline, capable of propagating surface waves. In this invention, a plurality of parallel surface waves, N in number, propagate across the surface of the substrate. At least one pair of vertical transducer stacks is disposed upon the crystal substrate, including an input, or launch, transducer stack capable of receiving an input electrical signal and an output, or receive, transducer stack. Each transducer includes at least a pair of interdigitated electrodes which are aligned perpendicular to the direction of wave propagation. The input signals may be of arbitrary nature, although generally they would be a sequence of pulses of constant amplitude.

A previous invention of the two coinvertors, U.S. Pat. No. 3,551,837, entitled Surface Wave Transducers With Sidelobe Suppression, which issued on 29 December 1970, utilized two propagation paths to provide sidelobe suppression, utilizing the autocorrelation function, resulting in a composite transducer with the bandwidth of a simple, one-element, transducer and coupling equal to that of a periodic array of simple transducers. This prior art invention however, required two acoustic paths for a single information path; in effect wasting one half of the available transduction area and information storage area. In addition, because of this limitation, the previous invention could not utilize an odd number of propagation paths — if three propagation paths were available, one would have to be wasted.

SUMMARY OF THE INVENTION

A number N of acoustic propagation paths is chosen. N launch vertical stacks of transducers are constructed, each making use of all N propagation paths. A set of N receiving vertical stacks of transducers is constructed, with the $j$-th receive stack identical to the $j$-th launch stack. The transducers of each stack are coded so that the response of the $j$-th receiving stack to an impulse applied to the $k$-th launch stack is an impulse if j and k are equal, and zero if $j$ and $k$ are unequal. Transducer codings to accomplish this are given hereinbelow, utilizing an N by N orthogonal matrix. If N, the number of paths, is such that there exists an N by N Hadamard matrix, then all of the transducer sections may be composed of elementary transducers with weights of plus one or minus one.

A Hadamard matrix is a square matrix all of whose elements are ±1, such that the matrix times its transpose is a multiple of the identity matrix. A Hadamard matrix is orthogonal but its columns are in general not orthonormal. The simplest form of a Hadamard matrix would consist of the rows 1, 1 and 1, −1. A transducer each of whose sections is the corresponding element of the Hadamard matrix does not provide much processing gain.

The transducer sections $A_{jk}$ may themselves be coded transducers, permitting the coupling to be more than N times that of a simple transducer, if desired.

For purposes of illustration, however, the $A_{jk}$ may be simple transducers with weights $c_{jk}$. If the matrix $c_{jk}$ is any orthogonal matrix, i.e., if $$\sum_{k=1}^{N} = c_{jk}c_{km} = \delta_{jm}$$

then the cross coupling between channels is zero. For $j$ not equal to $m$, the response of the $m$-th receiving stack to the signals launched by the $j$-th launch stack is zero.

OBJECTS OF THE INVENTION

One object of the invention is to provide a transducer device which permits efficient propagation of more than one acoustic surface wave across a substrate, even when the number of propagation paths is odd.

Another object of the invention is to provide a transducer device which permits a wideband response even when the individual transducers are not simple, that is, are multi-fingered.

Yet another object of the invention is the provision of a transducer device which minimizes crosstalk between adjacent channels.

Other objects, advantages, and novel features of the invention will become apparent from the following detailed description of the invention, when considered in conjunction with the accompanying drawings, wherein:

BRIEF DESCRIPTION OF THE DRAWINGS

FIG. 3 is a schematic diagram of a more specific embodiment of the multiplex transducer device, comprising simple-element transducers each having a weighting of plus or minus one.

FIG. 4 is a schematic diagram of a multiplex transducer device comprising simple transducers weighted according to the elements of two matrices reciprocal to each other.

FIG. 5 is a schematic diagram of a multiplex transducer device comprising complex, multi-element, transducers.

DESCRIPTION OF THE PREFERRED EMBODIMENTS

Figure 1:
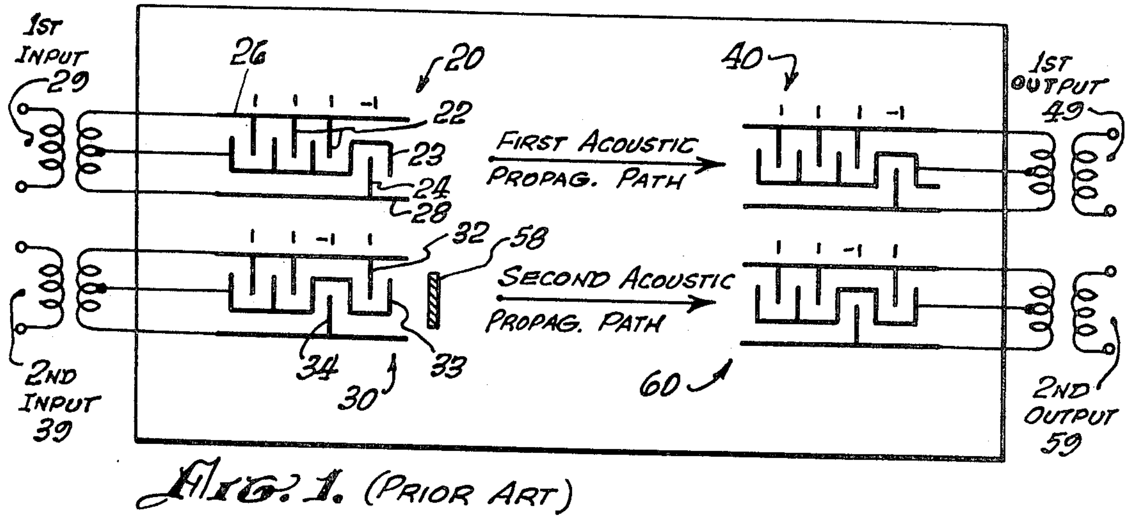
FIG. 1. (PRIOR ART)
FIG. 1 is a schematic drawing of prior art delay line incorporating interdigitated transducers and a shielding electrode.

Referring now to FIG. 1, this figure shows an embodiment of a prior art surface wave device 10 having a desired impulse response, comprising a substrate 12 capable of propagating surface waves, and an input, or launch, transducer pair, 20 and 30, both transducers being disposed upon the substrate in a parallel relationship. Each transducer 20 and 30 is a multi-element transducer, and includes a pair of sets 22 and 24 of parallel, linear, interdigitated, electrode elements, each set of elements being connected to a common bus bar, 26 and 28, respectively.

Both input transducers, 20 and 30, of the input transducer pair have their parallel elements, 22 and 24, and 32 and 34, weighted so that the sum of the weighting autocorrelation functions is a delta function.

The two inputs 29 and 39 and the two outputs 49 and 59 are shown connected in a manner so that each input and output is independent of the other. This permits greater flexibility and versatility of the connections.

Electrodes 23 and 33 are field-delineating, or shielding, electrodes, the use of which improves the correspondence between the mathematical weighting and the transducer impulse response, by delineating the shape of the electric field between the other two sets of electrodes, 22 and 24, and 32 and 34, respectively.

Figure 2:
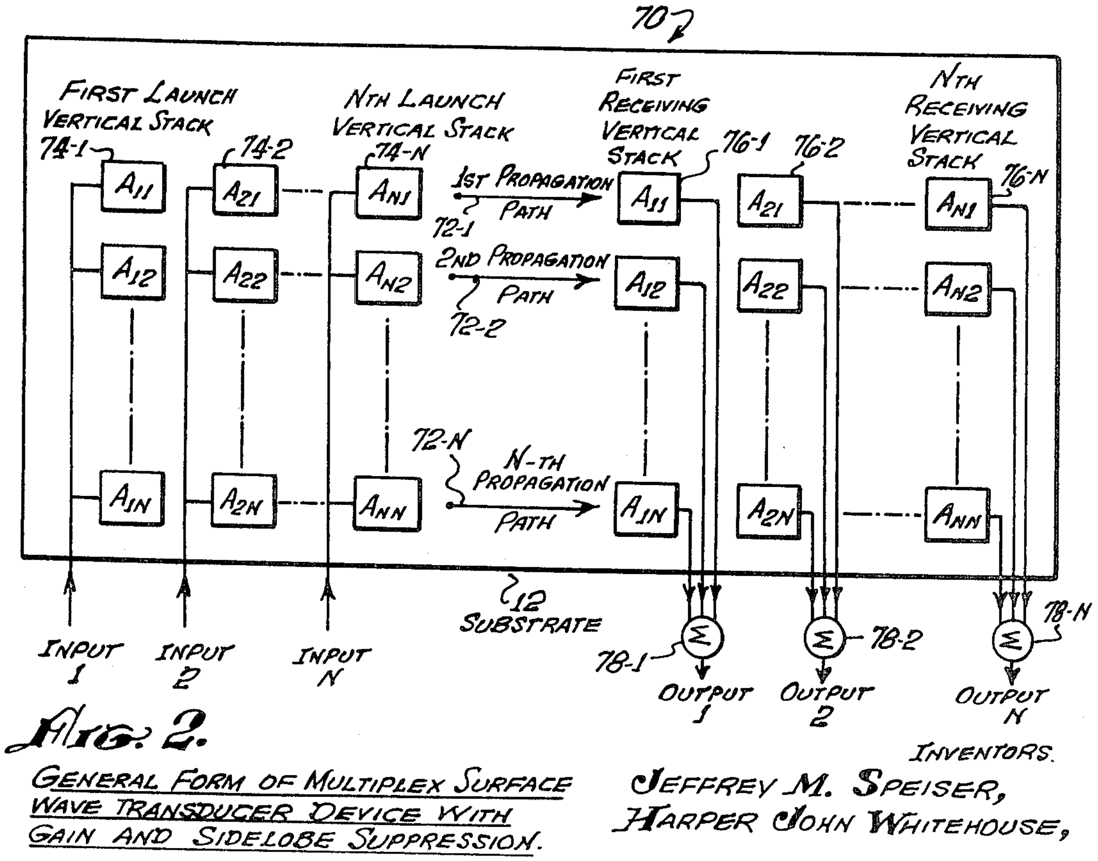
FIG. 2 is a schematic diagram of the multiplex surface wave transducer device with gain and sidelobe suppression in its most general form.

Referring now to FIG. 2, this figure shows a multiplex surface wave transducer device having gain and sidelobe suppression in its most general form. Therein is shown a surface wave multiplex transducer device 70, having N propagation paths, 72–1 through 72–N, comprising a substrate 12 and N–$n$ launch vertical stacks of transducers, the stacks being labeled 74–1 through 74–N, where $N \geq 3$ and $0 \leq n \leq N - 1$. Each stack consists of N transducers, labeled $A_{n1}$ through $A_{nN}$, whose inputs are connected together, the transducers being disposed upon the substrate 12 in a parallel relationship and capable of transmitting N parallel surface waves across the substrate.

Included in the embodiment 70 are N–$n$ receiving vertical stacks of transducers, labeled 76–1 through 76–N, each stack consisting of N transducers, also labeled $A_{n1}$ through $A_{nN}$, since the $j$-th receiving stack is identical to the corresponding $j$-th launch stack. The receiving vertical stacks, 76–1 through 76–N, are disposed upon the substrate 12 in a parallel relationship to the launch vertical stacks of transducers, 74–1 through 74–N, so as to receive the N parallel launched surface waves.

Each of the transducers, $A_{n1}$ through $A_{nN}$, of the $n$-th vertical stack 76–$n$ is connected to a summer 78–$n$, whose output, labeled output N, is available.

The (N–$n$)N launch stacks of transducers, 74–1 through 74–N, and the (N–$n$)N receiving stacks of transducers, 76–1 through 76–N, are so coded that the response of the $j$th receiving stack to an impulse applied to the k-th launch stack is an impulse if the numbers $j$ and $k$ are equal and zero if $j$ and $k$ are unequal.

Typically, transducers, whether elementary or composite, which are components of the multiplex transducer are mounted on a piezoelectric substrate 12, such as quartz. The transducers themselves could be vacuum-deposited on the substrate 12 in the form of aluminum.

Under ordinary conditions, all of the transducers would have to be mounted on one substrate because of the serious problem of reflection at the discontinuity formed at the interface of the two substrates. This is one limitation on the maximum size of the multiplex transducer, and is therefore a practical limitation on the maximum amount of storage information on one substrate.

All of the transducers need not, however, be on the same substrate. The transducers themselves could be mounted on smaller substrates, and these substrates in turn could be mounted on larger substrates. If this be done, then the orientation of the axes of the two kinds of substrates with respect to each other would have to be taken into account. The path delays must be closely equalized. Either the propagation distances must be kept the same and going in parallel directions, or if the paths are not quite parallel to each other, the position of the substrates with respect to the interdigitations must be modified so that the path delays are equal. Also, some of the material for the substrate may be made of anisotropic material, or there may be different propagation properties in different directions in an isotropic material, as well as having different degrees of coupling in different directions. The precautions that must be taken are well within the level of the art, the effect of the orientation of the crystal axes on the signal strength and the propagation velocities being well known in the prior art.

FIG. 2 shows an implementation of the multiplex transducer 70 wherein the $A_{jk}$ may either represent simple, one-element, transducers whose magnitudes and polarities are represented by the elements of an orthogonal matrix Q, or which may represent composite, multi-element, transducers whose components are derived by a Kronecker operation on the elements of matrix Q, as shown by illustrative codings hereinbelow.

The composite transducers which result from the Kronecker multiplication on simple transducers are such as to result in autocorrelation functions being added in a manner so as to eliminate sidelobes. This has been proved mathematically.

While optimal systems result when the number of rows of the launch or receive transducers, whether they be simple or composite, is equal to the number of columns of either the launch or receive transducers, that is, when there are N rows and N columns, a useful system exists even if one or more of the launch vertical stacks is deleted or not used, together with the corresponding receive vertical stacks. In short, the multiplex transducer device is useful with N–$n$ columns, where $0 \leq n \leq N-1$. This feature would be useful, for example, if one or more vertical columns became useless or defective for some reason.

The embodiment 70 shown in FIG. 2 represents N simultaneous delay lines, each with the same acoustic path length, since there are N inputs and N outputs, with no cross-coupling between the paths. The delay lines can store information, so long as more information is not put in greater than the bandwidth of the elementary, single-element, transducers of which the composite, multi-element, transducers are composed.

The launch columns, 74–1 through 74–N, need not be separated a uniform distance with respect to two adjacent columns, although this would generally be done. However, the distance between any two adjacent receive columns, 76–1 through 76–N, must be identical to the distance between two corresponding adjacent launch columns. This ensures that the relative delay between the two launch columns is identical to the delay between the two corresponding receive columns.

There are two basic spacings of importance under consideration here. One is the spacing between adjacent simple transducers which are components of a particular composite transducer and the other is the spacing between two vertical stacks, 74–1 through 74–N and 76–1 through 76–N.

In the case of surface waves using interdigitated electrodes, the ratio of the length of the individual fingers to the spacing between two adjacent fingers is great enough 1 ensure a narrow-beam signal and propagation paths, 72–a through 72–N, which are independent of each other. The length of an individual finger may typically be 15 to 20 wavelengths long.

As long as the propagation paths are well separated, cross-coupling is eliminated, even though each vertical stack uses all the propagation paths.

There are two angles to be considered with respect to surface wave transducers: the width of the radiation pattern of a launch transducer finger, and the angle subtended by a launch finger as seen from a receive finger. What is desired is that the angle of the radiation pattern, that is, of the main lobe of the radiation pattern, be less than the subtended angle. Because of this, no problems arise when a receive transducer stack, 76–1 through 76–N, is close to the corresponding launch transducer stack, 74–1 through 74–N. When a receive stack is far from the corresponding launch transducer stack, then problems may arise which may require the use of isolator strips to segregate the various acoustic paths, that is, disposed between the rows of transducers.

The spacing between columns of transducers need not be a function of the spacing between electrode elements. All that is required is that the path length from any launch vertical stack *j* to the corresponding receive stack *j* be the same for each launch-receive pair in the stack. Essentially what this guarantees is that correlation functions corresponding to each column of transducers superimpose in the proper manner to result in sidelobe cancellation.

Assume that there are N transducers in a vertical launch stack, and that the top member only, $A_{n1}$, of a vertical stack 74–*n* is displaced horizontally a short distance to the right. Then in the corresponding receive vertical stack, 76–*n*, there must be a corresponding displacement of the top transducer, $A_{n1}$ also, in the *j*-th vertical receive stack. This would insure that the acoustic delays are equal in all N acoustic paths.

More generally, the transducers of any particular vertical launch stack 74–*n* may be skewed horizontally, as long as the transducers of the corresponding vertical receive stack 76–*n* are skewed the same distance.

It two vertical launch stacks are interchanged, for example, if the first and *n*-th vertical stacks are interchanged, all that happens is that the delays for the first and *n*-th stacks are changed.

If the first and *n*-th rows are interchanged, all that happens is that the corresponding terms in the final summations for the correlation process are interchanged. This does not affect the total summation. To summarize, the rows or columns of the stacks of transducers may be interchanged with no effect on the overall results.

With respect to the maximum number of transducers in any one vertical stack, in the current state of the art the maximum number of transducers must be limited to approximately 16. However, the mathematical and signal processing theories on which the invention is based are not limited to this specific number.

In FIG. 3 is shown an embodiment 80 of a multiplex transducer device wherein the (N–*n*)N launch transducers 82L and (N–*n*)N receiving transducers 84R are simple, one-element, transducers configured to correspond to the elements of an orthogonal matrix. In this figure, the matrix is a Hadamard matrix, composed of the rows 1, 1, 1, 1; 1, 1, −1, −1; 1, −1, 1, −1 and 1, −1, −1, 1.

When the codings are derived from Hadamard matrices, all elementary transducer weights are equal to plus or minus one, providing maximum coupling for the available transduction area. On each information channel, pulse-in pulse-out response is obtained, something which could not have been obtained in a multi-element transducer by allowing simple amplitude weighting with a separate acoustic path for each information path.

The configuration itself guarantees pulse-in pulse-out response. The impulse response of the composite transducer between each input and the corresponding output is essentially the same as that of a simple transducer launching and a simple transducer receiving, except for the fact that a gain and improved coupling is realized for the composite transducer.

Another, more complex embodiment results if the receive stacks are not identical to the launch stacks. One such embodiment is shown in FIG. 4. In this figure is shown a multiplex transducer device 90, wherein one of the sets of vertical stacks of transducers, either the (N–*n*)N launch stacks, 91, 92 and 93, or the (N–*n*)N receive stacks, 94, 95 and 96, comprises transducers which are configured according to the N components of a set of independent basis vectors. The other of the sets of vertical stacks of transducers, either the (N–*n*)N receive stacks, 94, 95 and 96, or the (N–*n*)N launch stacks, 91, 92 and 93, comprises transducers which are configured according to the N components of a set of basis vectors which are reciprocal to the first-named set of basis vectors, or reciprocal to a multiple, as in this case.

To be more specific, if the basis for the launch transducers, 91, 92 and 93 is $A_{ij}$, then the corresponding basis for the receive transducers 94, 95 and 96 is $B_{ij}$, where the $A_{ij}$ and $B_{ij}$ are reciprocal bases, for *i*, *j* going from 1 to N. Each basis element $A_{ij}$ or $B_{ij}$ corresponds to a simple launch or receive transducer, respectively, having a physical position in the multiplex transducer which corresponds to the position of the basis element in its corresponding matrix.

A special case of the reciprocal basis transducer device may be built as follows.

Given the orthogonal matrix of Q having the entries: First row, 2, 2, 1; second row, −2, 1, 2; and, third row, 1, −2, 2. The orthogonality of matrix Q makes possible the use of the matrix Q in several different ways.

Since the matrix Q is a 3 × 3 matrix, in one embodiment, not shown, a matrix comprising nine transducers would have nine simple-element transducers, each having a weighting corresponding to the magnitude of the corresponding element in the Q matrix. The left-hand simple elements of the Q matrix of the launch stacks are connected together, and may be connected to a source of input signals.

Given the same Q matrix, other transducer configurations may be derived from this matrix. In another, second, embodiment, also not shown, the transducers may be arranged into three rows of transducers, each row comprising a transducer with three elements. The element weights on one of these transducers is given by considering the values of the elements of each row of the matrix Q. In this second configuration, there are three launch transducers and three receive transducers which sum the outputs. In this embodiment there would be only a single propagation channel, since there is only one launch and only one receive stack of transducers.

A third manipulation of the matrix Q is possible. The matrix Q may be used to define a matrix of transducers of some length, say length N. From this matrix, new transducer codings of length 3N may be produced or generated.

Take a given coding having pulse-in pulse-out response and zero crosstalk. An orthogonal matrix like Q may be used to build up longer codings with the same properties. Use may be made of an orthogonal matrix to build up longer transducers having the same input-output properties and the same minimal cross-coupling properties and with greater gain, since more transducer elements are used per transducer section.

Elaborating upon this concept, assume there are nine launch transducers and nine receive transducers, launching on three vertical stacks and receiving on three vertical stacks. Assume these transducers are of length N. By taking the Kronecker product of the weightings with an orthogonal matrix like Q, new codings of length 3N may be built which have the same pulse-in pulse-out response as the transducer array where each transducer had a shorter coding.

In general, short codings are not too useful. One of the main reasons for using coded transducers is to reduce the insertion loss.

An illustrative coding with N = to 3 follows:

| | | |
|---|---|---|
| $A_{11} = 4\ -4\ 1$ | $A_{21} = 4\ 2\ -2$ | $A_{31} = 2\ 4\ 2$ |
| $A_{12} = -4\ -2\ 2$ | $A_{22} = -4\ 1\ -4$ | $A_{32} = -2\ 2\ 4$ |
| $A_{13} = 2\ 4\ 2$ | $A_{23} = 2\ -2\ -4$ | $A_{33} = 1\ -4\ 4$ |

The designation $A_{11} = 4\ -4\ 1$ designates a series of three simple transducers in one row having magnitudes and polarities of +4, −4, and +1, respectively, as shown in FIG. 5.

The above codings were generated from the same orthogonal matrix $$Q=\begin{bmatrix} 2 & 2 & 1 \\ -2 & 1 & 2 \\ 1 & -2 & 2 \end{bmatrix}$$

as follows: The columns of Q are mutually orthogonal, and so an allowable simple coding, corresponding to the second embodiment described hereinabove, is:

| | | |
|---|---|---|
| $A^0_{11} = 2$ | $A^0_{21} = 2$ | $A^0_{31} = 1$ |
| $A^0_{12} = -2$ | $A^0_{22} = 1$ | $A^0_{32} = 2$ |
| $A^0_{13} = 1$ | $A^0_{23} = -2$ | $A^0_{33} = 2$ |

Taking the Kronecker product of orthogonal matrix Q with each of its columns, there results

| | | | | |
|---|---|---|---|---|
| 2 2 1 | | 2 | | 4−4 1 = $A_{11}$ |
| −2 1 2 | ⊗ | −2 | = | −4−2 2 = $A_{12}$ |
| 1−2 2 | | 1 | | 2 4 2 = $A_{13}$ |
| 2 2 1 | | 2 | | 4 2−2 = $A_{21}$ |
| −2 1 2 | ⊗ | 1 | = | −4 1−4 = $A_{22}$ |
| 1−2 2 | | −2 | | 2−2−4 = $A_{23}$ |
| 2 2 1 | | 1 | | 2 4 2 = $A_{31}$ |
| −2−1 2 | ⊗ | 2 | = | −2 2 4 = $A_{32}$ |
| 1−2 2 | | 2 | | 1−4 4 = $A_{33}$ |

A still more complex multiplex transducer device is shown in FIG. 5, wherein is shown a device 100, wherein each transducer 102 is a composite, or non-simple, transducer, the relative weightings of whose interdigitated electrodes are obtained by taking the Kronecker product of the orthogonal matrix and each column of the matrix, as just described.

The technique for computing the weightings of a four-by-four Hadamard matrix to obtain a matrix of multi-element transducers similar to the manner in which the weightings of the transducers 102 shown in FIG. 5 where obtained is shown immediately following.

$$Q=H_4=\begin{matrix} 1 & 1 & 1 & 1 \\ 1 & \bar{1} & 1 & \bar{1} \\ 1 & 1 & \bar{1} & \bar{1} \\ 1 & \bar{1} & \bar{1} & 1 \end{matrix} \quad = \text{a Hadamard matrix with } N=4$$

An allowable coding is $A_{jk} = (H_4)_{jk}$

Generating a longer allowable coding by Kronecker multiplication, one obtains:

| | | | | | | |
|---|---|---|---|---|---|---|
| $A_{11}$ | | 1 1 1 1 | | 1 | | 1 1 1 1 |
| $A_{12}$ | = | $1\ \bar{1}\ 1\ \bar{1}$ | ⊗ | 1 | = | $1\ \bar{1}\ 1\ \bar{1}$ |
| $A_{13}$ | | $1\ 1\ \bar{1}\ \bar{1}$ | | 1 | | $1\ 1\ \bar{1}\ \bar{1}$ |
| $A_{14}$ | | $1\ \bar{1}\ \bar{1}\ 1$ | | 1 | | $1\ \bar{1}\ \bar{1}\ 1$ |
| $A_{21}$ | | 1 1 1 1 | | 1 | | $1\ \bar{1}\ 1\ \bar{1}$ |
| $A_{22}$ | = | $1\ \bar{1}\ 1\ \bar{1}$ | ⊗ | $\bar{1}$ | = | $\bar{1}\ 1\ 1\ 1$ |
| $A_{23}$ | | $1\ 1\ \bar{1}\ \bar{1}$ | | 1 | | $1\ \bar{1}\ \bar{1}\ 1$ |
| $A_{24}$ | | $1\ \bar{1}\ \bar{1}\ 1$ | | $\bar{1}$ | | $1\ 1\ \bar{1}\ \bar{1}$ |
| $A_{31}$ | | 1 1 1 1 | | 1 | | $1\ 1\ \bar{1}\ \bar{1}$ |
| $A_{32}$ | = | $1\ \bar{1}\ 1\ \bar{1}$ | ⊗ | 1 | = | $1\ \bar{1}\ \bar{1}\ 1$ |
| $A_{33}$ | | $1\ 1\ \bar{1}\ \bar{1}$ | | $\bar{1}$ | | 1 1 1 1 |
| $A_{34}$ | | $1\ \bar{1}\ \bar{1}\ 1$ | | $\bar{1}$ | | $1\ \bar{1}\ 1\ \bar{1}$ |
| $A_{41}$ | | 1 1 1 1 | | 1 | | $1\ \bar{1}\ \bar{1}\ 1$ |
| $A_{42}$ | = | $1\ \bar{1}\ 1\ \bar{1}$ | ⊗ | $\bar{1}$ | = | $1\ 1\ \bar{1}\ \bar{1}$ |
| $A_{43}$ | | $1\ 1\ \bar{1}\ \bar{1}$ | | 1 | | $1\ \bar{1}\ 1\ 1$ |
| $A_{44}$ | | 1 1 1 1 | | 1 | | 1 1 1 1 |

To build composite transducers, given the simple basis and reciprocal basis transducers, requires use of the same algorithm as was used when corresponding launch and receive transducers were identical.

A multiplex transducer whose components are arranged according to the elements of an identity matrix would fulfill the requirements of the transducer configurations of this invention, but is considered to be a trivial case.

Discussing now in more detail the theoretical background of the invention, the reason that the new transducer codings which are obtained by taking the Kronecker product of the matrix Q and each of the rows of the matrix Q successively works is the following. When a signal is launched by one vertical stack and received by another similar receive stack, there exists a time-invariant linear system with impulse response which is a sum of cross-correlation functions. In actuality, the function may be an autocorrelation or a cross-correlation function. If the launch stack is identical to the receive stack, then the response function is a sum of autocorrelation functions. If the launch and receive vertical stacks are not identical, then the output is a sum of cross-correlation functions, as was the situation shown in FIG. 4, where the launch and receive transducers corresponded to reciprocal basis vectors.

In general, the sum of cross-correlation functions can be interpreted in terms of the generating functions of the sequences. For example, assume that the launch stacks comprise transducers which can be labeled $\alpha_1, \ldots, \alpha_P$ for P channels. The receive vertical stacks have weightings which may be labeled $\beta_1, \ldots, \beta_P$, for the P number of channels. The impulse response is the sum from $k = 1$ to $k = P$ of $\alpha_k$ correlated with $\beta_k$. If the generating function be carefully examined, it looks like the sum from $k = 1$ to $k = P$ of the generating function, $\alpha_k(Z)$ times the generating function $\beta_k = (1/Z$.

The cross-correlation sum may be described as an inner product between vectors. The summation in the Z-transform domain looks like a scalar product of two vectors. However, the scalar product must be examined to see how it changes when longer sequences are built. The algorithms described in terms of the Z-transforms of the polynomials is equivalent to a unitary transformation of the space.

An alternative configuration may be used to generate large-amplitude surface waves.

For detailed background information, reference is directed to U.S. Pat. No. 3,551,837, entitled Surface Wave Transducers with Side Lobe Suppression, by the same inventors as this invention, and which issued on 29 December 1970. In brief, therein is described the manner in which large-amplitude acoustic waves are generated using Golay configurations and a half-silvered mirror. The use of the mirror causes the generated acoustic signal to propagate in two directions, one path being parallel to the direction of the generating surface wave, and the other direction being at right angles to the direction of the generating acoustic surface wave, because of reflection off the mirror, which is placed at an angle of 45° to the path of the generating surface wave.

There is a launch transducer with coding A and another launch transducer with coding B, the complement of coding A. Transducers A and B launch signals at right angles to each other toward the half-silvered mirror which is at an angle of 45° to both propagating signals. The two signals intersect at the half-silvered mirror. The two signals are therefore summed in the direction of propagation of each of the two signals.

Assume two such devices, that is, two pairs of transducers coded according to the two members of a complementary pair. Transducer A launches a signal to the right. Transducer B launches a signal vertically upwards. The sum of the two signals is being launched to the right.

Assume another pair of transducers C and D, forming another Golay complementary pair. These two transducers C and D are disposed below and to the right of the other complementary pair of transducers A and B. The combined A and B beams propagate to the right, while the beam generated by the C and D transducers propagates vertically upwards. Assume now a second half-silvered mirror disposed at 45° to each of the two last-named beams, the one generated by transducers A and B and the other generated by transducers C and D. To the right of the half-silvered mirror, the two beams generated by transducers A and B and transducers C and D will combine, and the same two beams will also combine in a vertically upward direction. The resultant wave at the right side or at the top side is the sum of the four waves generated by transducers A, B, C, and D.

The A transducer is driven by a sequence of pulses which correspond to the coding of transducer A, transducer B is driven by a sequence of pulses which correspond to the coding of transducer B, and similarly for transducers C and D. Therefore, each of the propagating acoustic waves has a wave form which is a correlation function of codings A, B, C, and D. Therefore, the summed signal is the sum of the four autocorrelation functions, which is simply a $\delta$ function.

While the embodiments described hereinabove relate to surface waves, the same principles are applicable to bulk-type waves and indeed even to electromagnetic beams traversing a medium, provided of course that the various beams are isolated from each other. For background information, on electromagnetic embodiments, reference is directed to U.S. Pat. No. 3,487,203, entitled Torsional Delay Line Matched Filter Device, by Lindsay et al. In interdigitated transducers, there are gaps between any two adjacent electrodes, the relative orientation of the two electrodes with respect to the gap defining a specific one of the binary states. The analogous electromagnetic implementation involves the specific one of two ways in which a wire may be wrapped or coiled about a torsional delay line, either clockwise about the delay line or counterclockwise around the delay line.

The electromagnetic analogy to surface wave lines having a matrix of transducer elements is the following: Given N delay lines, assume a coil wrapped around each of the N delay lines. Each of the conductors are wrapped around the delay line in a coded manner, as described in the patent mentioned hereinabove. All N conductors, or coils, are driven in parallel. At the output side of each coil is placed another delay line. The outputs of all N coils are then summed together.

Let it be assumed that, at the input side, another set of N coils are wrapped around the same torsional delay line. The outputs of the second set may be summed together as was the first set. Similarly, a third set of coils may be wrapped around the same torsional delay line, and the outputs summed together as were the other two sets of coils.

The three sets of coil conductors would correspond to a vertical stack comprising three rows of transducers.

Elaborating further, assume four sets of coils, with four independent inputs and four independent outputs. A non-interacting pair of complementary sets may be defined as two pairs of Golay binary sequences, which may be designated A, B, A*, B*, such that the autocorrelation function of A plus the autocorrelation function of B is $\delta$, and the sum of the autocorrelation functions of A* and B* is equal to the $\delta$ function. Also, the sum of the cross-correlation function of A and A* plus the cross-correlation function of B with B* is 0. The starred and unstarred terms are defined by the foregoing equations.

What is claimed is:

1. A surface wave multiplex transducer device, having N propagation paths, and capable of propagating N distinct signals, comprising:

a substrate;

N–$n$ composite launch vertical stacks of transducers, where N $\geq$ 3 and 0 $\leq$ $n$ $\leq$ N–1, each stack consisting of N transducers whose inputs are connected together, disposed upon the substrate in a parallel relationship and capable of transmitting N parallel surface waves across the substrate;

N–$n$ composite receiving vertical stacks of transducers, each stack consisting of N transducers whose outputs are connected together, the $j$-th receiving stack being identical to the corresponding $j$-th launch stack, the receiving vertical stacks being disposed upon the substrate in a parallel relationship to the launch vertical stacks of transducers, so as to receive the N parallel launched surface waves;

the (N–$n$)N launch and the (N–$n$)N receiving stacks of transducers being so coded that the response of the $j$-th receiving stack to an impulse applied to the $k$-th launch stack is an impulse if the numbers $j$ and $k$ are equal and zero if $j$ and $k$ are unequal.

2. A multiplex transducer according to claim 1, wherein the transducers are interdigitated and include a field-delineating electrode between the interdigitations.

3. A multiplex transducer device according to claim 2, wherein the (N–$n$)N launch transducers and (N–$n$)N receiving transducers are simple, one-element, transducers configured to correspond to the elements of an orthogonal matrix.

4. A multiplex transducer device according to claim 3, wherein the orthogonal matrix is a Hadamard matrix.

5. A multiplex transducer device according to claim 3, wherein one of the sets of vertical stacks of transducers, either the (N–$n$)N launch stacks or the (N–$n$)N receive stacks, comprises transducers which are configured according to the N components of a set of independent basis vectors; and the other of the sets of vertical stacks of transducers, either the (N–$n$)N receive stacks or the (N–$n$)N launch stacks, comprises transducers which are configured according to the N components of a set of basis vectors which are reciprocal to the first-named set of basis vectors.

6. A multiplex transducer device according to claim 2, wherein each transducer is a composite, or non-simple, transducer, the relative weightings of whose interdigitated electrodes are obtained by taking the Kronecker product of the orthogonal matrix and each column of the matrix.

7. A multiplex transducer device according to claim 3, wherein $n$ equals zero, and there are therefore N vertical stacks of launch and N vertical stacks of receive transducers, each stack containing N transducers.

* * * * *